United States Patent
Michiura

(10) Patent No.: US 6,432,353 B1
(45) Date of Patent: Aug. 13, 2002

(54) METHOD FOR PRODUCING OXIDE TYPE CERAMIC SINTERED BODY

(75) Inventor: Nobuhiko Michiura, Hirakata (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 09/458,257

(22) Filed: Dec. 9, 1999

(30) Foreign Application Priority Data

Dec. 9, 1998 (JP) .......................................... 10-349644

(51) Int. Cl.$^7$ .............................................. C04B 35/64
(52) U.S. Cl. ...................... 264/674; 264/43; 264/648; 264/681
(58) Field of Search ................................. 264/674, 648, 264/681, 43

(56) References Cited

U.S. PATENT DOCUMENTS

| | | | |
|---|---|---|---|
| 5,094,787 A | * | 3/1992 | Nakajima .................... 264/674 |
| 5,133,129 A | * | 7/1992 | Thomson .................... 264/674 |
| 5,998,319 A | * | 12/1999 | Hintermayer ............... 264/683 |

FOREIGN PATENT DOCUMENTS

| | | |
|---|---|---|
| EP | 0358049 A1 | 3/1990 |
| EP | 0466122 A1 | 1/1992 |

* cited by examiner

Primary Examiner—James Derrington

(57) ABSTRACT

A ceramic molded body obtained by molding a raw material powder having a mean grain size of about 1 μm or less and a BET specific surface area of about 5 m$^2$/g or more is fired in an atmosphere of about 95% or higher oxygen concentration at a temperature higher than an ordinary firing temperature for a time shorter than an ordinary time, whereby the sintering can be completed in a short time.

8 Claims, 2 Drawing Sheets

EXAMPLE 1

EXAMPLE 1

COMPARATIVE EXAMPLE 1

EXAMPLE 2

COMPARATIVE EXAMPLE 2

METHOD FOR PRODUCING OXIDE TYPE CERAMIC SINTERED BODY

BACKGROUND OF THE INVENTION

1. Field of the Invention

The present invention relates to a method for producing an oxide type ceramic sintered body, and more particularly to a production of a dense oxide type ceramic sintered body.

2. Description of the Related Art

With recent advancement of high density integration techniques for electronic components, development of a technique for applying fine wiring on electronic components or wiring substrates has been in progress. In many cases, these electronic components and the wiring substrates are made of oxide type ceramic sintered bodies. Generally, oxide type ceramic sintered bodies are polycrystals, and therefore pores having a size of about several tens of $\mu$m, formed during a sintering process, are present at the surfaces of sintered bodies. These pores cause the problems that fine wires on electronic components or wiring substrates are interrupted, and so forth.

Known are a method of producing a hard disk substrate material as described in Laid-open Japanese Patent Application No. 5-325180, a method of producing an ITO (indium-tin oxide) sintered body as described in Laid-open Japanese Patent Application No. 6-183732, and a method of producing a piezoelectric ceramic as described in Japanese Patent Publication No. 55-19073 have been proposed.

According to the method described in the '180 Laid-open, firing at a low temperature in the atmosphere or in a reducing or inert gas atmosphere is carried out, and thereafter, HIP (hot isotropic pressing) treatment is conducted. According to the '732 Laid-open, proposed is a technique by which sintering at atmospheric pressure is enabled by adjustment of the grain size and compounding of raw material powders. In addition, according to the '073 publication, grain growth can be inhibited by accelerating the cooling rate (1200° C./hour) after firing.

The oxide type ceramic sintered body, which is an object of the present invention, is intended to be used specifically as a material for filters and wiring substrates operable in a microwave band or a millimeter wave band or as an optical material. Because of this, the materials and uses which are objects of the above-described conventional technical methods are different from those alit in the specific embodiments of the present invention.

As regards to the method described in the '180 Laid-open, there are the problems that equipment for the HIP treatment is expensive, a reducing or inert gas atmosphere when employed as the firing atmosphere is unsuitable for firing of oxide type ceramics, the method of producing a sintered body is complicated and troublesome, and so forth.

Referring to the technique described in the Laid-open '732, the kind of raw materials has a limitation that it is restricted to ITO. It is not necessarily possible to use another material.

Referring to the technique described in the '073 publication, the cooling is conducted rapidly. This causes the problem that a large sintered body may be cracked.

SUMMARY OF THE INVENTION

Accordingly, it is an object of the present invention to provide a method of producing a dense oxide type ceramic sintered body of which the number of pores is extremely decreased with the above-described problems being solved.

To solve the above-described technical problems, according to the present invention, there is provided a method of producing an oxide type ceramic sintered body which comprises the steps of molding a raw material powder having a mean grain size of about 1 $\mu$m or less and a BET (Brunauer, Emmett and Teller) specific surface area of about 5 $m^2$/g or more to produce a ceramic molded body, and firing the ceramic molded body in an atmosphere of about 95% or higher oxygen concentration at a temperature higher than the lowest sintering temperature of the raw material powder for a time shorter than the time in which the sintering can be achieved at the lowest sintering temperature.

As described above, the mean grain size of the raw material powder is preferably about 1 $\mu$m or less, and the BET specific surface area is also preferably about 5 $m^2$/g or more. When the mean grain size exceeds about 1 $\mu$m or the BET specific surface area is less than about 5 $m^2$/g, pores formed in a produced ceramic molded body are excessively large. As a result, the pore size in the obtained ceramic sintered body is too large.

The raw material powder may be produced simply by mixing the oxides or carbonates of the respective metal elements to be contained in a desired oxide type ceramic sintered body, or may be powders produced by calcining the above-described mixed powders. Preferably, the purities of these raw material powders are as high as possible.

In the step of producing the above-described ceramic molded body, the ceramic molded body is produced so as to have good qualities. More concretely, when wet-molding is applied, slurry is produced so as to have a high density and a high dispersion degree. On the other hand, dry-molding is applied, granulation is carried out so as to produce grains having high crushing properties.

In the ceramic molded body obtained in the molding step, it is preferable that the pore size is small, and pores need to be evenly dispersed and small, as though the density of the molded body is low. Preferably, the maximum pore size in the ceramic molded body is up to about 0.5 $\mu$m.

As described above, it is preferable that the maximum pore size in the ceramic molded body is about 0.5 $\mu$m or less. This is because when pores having a pore size of more than about 0.5 $\mu$m are present in the ceramic molded body, the sintering becomes uneven, which may cause the abnormal grain growth. As a result, large pores may be formed in the produced ceramic sintered body.

The firing step is carried out in an atmosphere of about 95% or higher oxygen concentration. Preferably, the oxygen concentration is as high as possible. More preferably, it is set to be about 98% or higher.

Referring to the firing temperature in the firing step and the time in which the firing step is carried out, pore growth is inhibited by firing at a lower temperature for a longer time according to conventional knowledge. However, according to the present invention, characteristically, the sintering is carried out at a firing temperature higher than the lowest sintering temperature of the raw material powder and for a time shorter than the time in which the sintering can be achieved at the lowest sintering temperature. In other words, the sintering is carried out above the temperature applied in the ordinary firing process for a time shorter than the time in which the ordinary firing process is carried out.

Referring to the firing temperature and the firing time in the above-described firing step from another standpoint, the firing time is shortened by raising the firing temperature in the firing step, whereby a tight oxide type ceramic sintered body is produced.

In addition, it is effective to set the temperature-rising rate during firing to be higher than the temperature-rising rate which is an conventional firing condition in order to obtain a tight oxide type ceramic sintered body. Preferably, a temperature-rising rate of about 180° C./hour or higher is selected. This is because when the temperature-rising rate is less than about 180° C./hour, the sintering becomes uneven, which may cause abnormal grain growth. Especially when a volatile component such as Pb or the like is present, the evaporation amount of the component is increased during firing. This may cause abnormal grain growth.

The present invention is applied especially advantageously when the oxide type ceramic sintered body is a dielectric ceramic sintered body.

Other features and advantages of the present invention will become apparent from the following description of the invention which refers to the accompanying drawings.

DETAILED DESCRIPTION OF EMBODIMENTS OF THE INVENTION

EXAMPLE 1

As powdery raw materials, high purity powders of $TiO_2$, $ZrO_2$, $SnO_2$, ZnO, NiO and $Ta_2O_5$ were prepared.

A raw material powder was prepared by compounding these powders so as to contain as major components 38% by weight of $TiO_2$, 47% by weight of $ZrO_2$, and 15% by weight of $SnO_2$, and as addition components, 0.126 parts by weight of ZnO, 0.500 parts by weight of NiO, and 0.740 parts by weight of $Ta2O_5$ based on 100 parts by weight of the major components. The raw material powder was dispersed in water, placed into a ball mill and wet mixed for 16 hours to obtain a slurry. The raw material powder in the obtained slurry had a mean grain size of 0.7 μm, and a BET specific area of 19.0 $m^2$/g.

After this, the slurry was cast to form a sheet-shape ceramic molded body having a square 60 mm×60 mm plan shape, and a thickness of 3 mm. The obtained ceramic molded body was dried at 35° C. for 24 hours.

Next, the dried ceramic molded body was fired to obtain a ceramic fired body. The temperature was raised at a temperature-rising rate of 300° C./hour to 1450° C. in an atmosphere with a 95% oxygen concentration, and the temperature was maintained for 30 minutes.

In Comparative Example 1, the ceramic molded body produced as described above was fired in an atmosphere having a 95% oxygen concentration, at a temperature-rising rate of 60° C./hour to 1350° C., with the temperature of 1350° C. being maintained for 4 hours. As a result, a ceramic sintered body was obtained. The temperature of 1350° C. is the lowest sintering temperature, that is, the temperature is the lowest temperature which is required to sinter the above-described raw material powder. Note that this value may change depending on the raw material powder and firing atmosphere.

After this, the surfaces of the ceramic sintered bodies in Example 1 and Comparative Example 1 were mirror-finished with a lapping machine. Pores in the mirror-finished surfaces were evaluated with an image analytic apparatus. The evaluation results are shown in the following TABLE 1.

TABLE 1

|  | Maximum Pore Size (μm) | Pore-Occupying Area Rate (%) |
| --- | --- | --- |
| Example 1 | 2 | 0.2 |
| Comparison Example 1 | 13 | 3 |

TABLE 1 shows that the maximum pore size and the pore-occupying area ratio in Example 1 are significantly improved as compared with those in Comparative Example 1.

Figure 1:
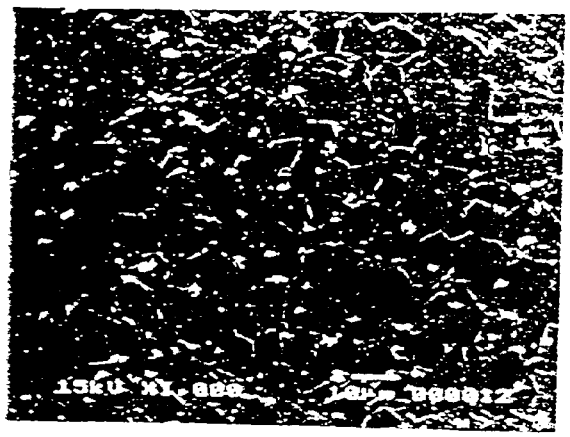
FIGS. 1 and 2 are scanning electron microscopic representations of the ceramic sintered bodies obtained in Example 1 and Comparative Example 1, respectively.

The respective ceramic sintered bodies as described above in Example 1 and Comparative Example 1 were thermally etched, and observed with a scanning type electron microscope (SEM), respectively. The results are shown in FIG. 1. As can be seen, the ceramic sintered body of Example 1 has a more even crystalline grain size compared with the ceramic sintered body in Comparative Example 1.

EXAMPLE 2

As powdery raw materials, high purity powders of $BaCO_3$, $Nd_2O_3$, $TiO_2$, PbO and $Bi_2O_3$ were prepared.

A raw material powder was prepared by compounding these powders so as to contain as major components 12 mol % of $BaCO_3$, 26 mole % of $Nd_2O_3$, and 62 mol % of $TiO_2$, and as addition components 4.0 parts by weight of PbO and 11.0 parts by weight of $Bi_2O_3$, based on 100 parts by weight of the major components. The obtained raw material powder was mixed and calcined in the air at 1100° C. for 1 hour.

After this, the calcined raw material powder was wet crushed and dried to obtain a pulverized powder with a mean grain size of 0.5 μm and a BET specific surface area of 20 $m^2$/g. Next, the obtained pulverized powder together with water and a dispersant was placed into a ball mill and mixed for 16 hours to form slurry.

Next, the slurry was cast to form a sheet-shape ceramic molded body having a 60 mm×60 mm plan shape, and a thickness of 3 mm. The formed ceramic molded body was dried at 35° C. for 24 hours.

Next, the dried ceramic molded body as described above was fired to obtain a ceramic sintered body at a temperature-rising rate of 300° C./hour to 1350° C., and the temperature was maintained for 30 minutes, in an atmosphere having a 95% oxygen concentration.

In Comparative Example 2, the temperature was raised at a temperature-rising rate of 60° C./hour to 1250C., and the temperature of 1250° C. was maintained for 4 hours, in the 95% oxygen concentration atmosphere.

For evaluation of the state of pores, the respective surfaces of the ceramic sintered bodies of Example 2 and Comparative Example 2 were mirror-finished with a lapping machine, and pores at the mirror-finished surfaces were evaluated by means of an image-analytic apparatus. The evaluation results are shown in the following TABLE 2.

TABLE 2

|  | Maximum Pore Size (μm) | Pore-Occupying Area Rate (%) |
|---|---|---|
| Example 2 | 2 | 0.2 |
| Comparison Example 2 | 10 | 3 |

As seen in TABLE 2, the maximum pore size and the pore-occupying area ratio in Example 2 are considerably improved as compared with those in Comparative Example 2.

Figure 2:
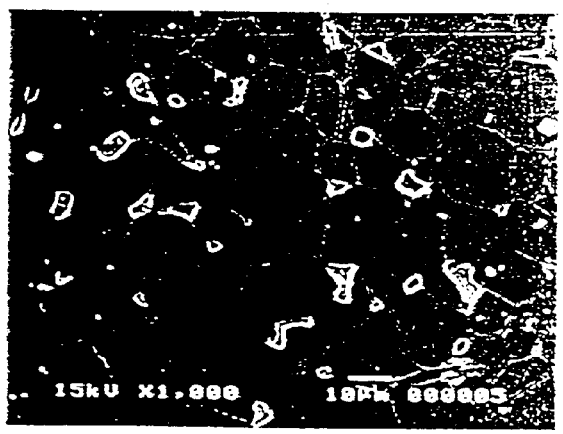
Figure 3:
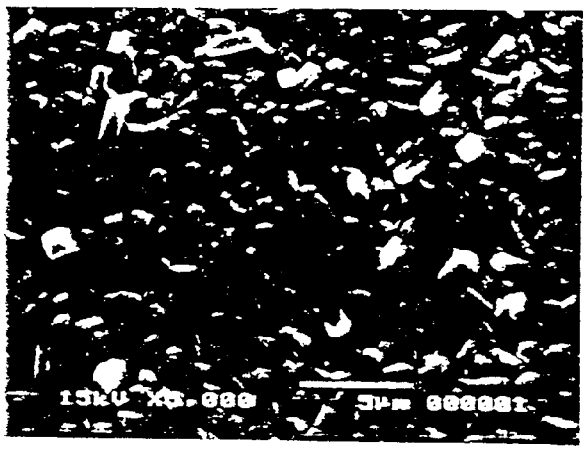
FIGS. 3 and 4 are scanning electron microscopic representations of the ceramic sintered bodies obtained in Example 2 and Comparative Example 2, respectively.
Figure 4:
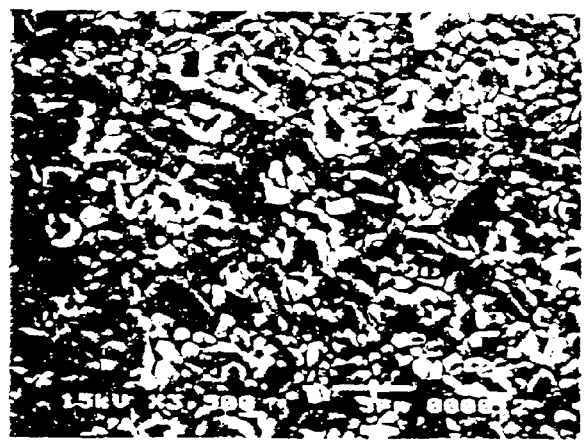

The ceramic sintered bodies obtained in Example 2 and Comparative Example 2 were thermally etched and thereafter observed with a scanning electron microscope. The results are shown in FIG. 2. As can be seen, the ceramic sintered body of Example 2 has a more even crystalline grain size than that of Comparative Example 2.

In this Example, the raw material powder contains a volatile component (Pb). According to the method of producing a ceramic sintered body of the above-described Example 2, a volatile component such as Pb or the like can be inhibited from evaporating since the sintering is completed in a short time, so that the time when the ceramic molded body to be fired is exposed to a high temperature is short and moreover, the firing is conducted in a high oxygen atmosphere. This contributes to the enhancement of the tightness of the obtained ceramic sintered body and a more even size of the crystalline grains contained in the ceramic sintered body.

As described above, by producing a tight ceramic molded body and firing it at a low temperature according to the present invention, a tight oxide type ceramic sintered body with less pores and smaller pore size can be produced. In this case, it is unnecessary to take measures to inhibit the growth of pores, pressing at firing, and the like.

Pursuant to the present invention, adjusting the maximum pore size in a ceramic molded body to about 0.5 μm or smaller, and selecting the temperature-rising rate during firing of about 180° C./hour or higher, allows more uniform sintering to be achieved, and abnormal grain growth to be inhibited. The raw material powder has a mean grain size of about 1 μm or less, preferably about 0.8 μm or less, and a BET specific surface area of about 5 $m^2$/g or more, preferably about 10 $m^2$/g or more.

Accordingly, the oxide type ceramic sintered body produced according to the present invention can be advantageously applied as materials for filters or wiring substrates for use in a microwave band and a millimetric band, and as optical materials, for example.

What is claimed is:

1. A method of producing an oxide ceramic sintered body which comprises the steps of:

molding a raw material oxide ceramic powder having a mean grain size of about 1 μm or less and a BET specific surface area of about 5 $m^2$/g or more to produce a ceramic molded body having a maximum pore size of about 0.5 μm or less, and firing said ceramic molded body in an atmosphere having an oxygen concentration of about 95% or higher at a temperature at least 100° C. higher than the lowest sintering temperature of said raw material powder for a time shorter than the time at which the sintering can be achieved at said lowest sintering temperature;

wherein the temperature during firing in the firing step is raised at a rate of 180° C./hour or higher.

2. A method of producing an oxide type ceramic sintered body according to claim 1, wherein said raw material powder is a dielectric ceramic raw material powder.

3. A method of producing an oxide type ceramic sintered body according to claim 2, wherein the mean grain size of said powder is about 0.8 μm or less and the BET specific surface area is about 10 $m^2$/g or more.

4. A method of producing an oxide type ceramic sintered body according to claim 3, wherein the atmosphere has an oxygen concentration of about 98% or higher.

5. A method of producing an oxide type ceramic sintered body according to claim 1, wherein the mean grain size of said powder is about 0.8 μm or less and the BET specific surface area is about 10 $m^2$/g or more.

6. A method of producing an oxide type ceramic sintered body according to claim 2, wherein the atmosphere has an oxygen concentration of about 98% or higher.

7. A method of producing an oxide type ceramic sintered body according to claim 1, wherein the atmosphere has an oxygen concentration of about 98% or higher.

8. A method of producing an oxide type ceramic sintered body according to claim 1, wherein the temperature during firing in the firing step is raised at a rate of 300° C./hour or higher.

* * * * *